United States Patent [19]

Ogawa et al.

[11] 4,118,695
[45] Oct. 3, 1978

[54] DATA PROCESSING SYSTEM

[75] Inventors: Toshiya Ogawa; Akio Niki; Kazuo Uchimura; Koichi Tsuruoka, all of Tokyo, Japan

[73] Assignee: Ricoh Company, Ltd., Tokyo, Japan

[21] Appl. No.: 530,003

[22] Filed: Dec. 5, 1974

[30] Foreign Application Priority Data

Dec. 5, 1973 [JP] Japan .............................. 48-135318

[51] Int. Cl.² .............................................. G06F 3/14
[52] U.S. Cl. ............................... 340/324 AD; 178/30
[58] Field of Search ....... 340/324 AD, 324 R, 324 A, 340/336; 178/15, 30

[56] References Cited

U.S. PATENT DOCUMENTS

| 3,166,636 | 1/1965  | Rutland et al. ............ 340/324 A   |
| 3,524,182 | 8/1970  | Criscimagna et al. ...... 340/324 AD   |
| 3,541,541 | 11/1970 | Engelbart ............... 340/324 AD    |
| 3,609,743 | 9/1971  | Lasoff et al. ............ 340/324 AD   |
| 3,786,477 | 1/1974  | Baumgartner ............. 340/324 AD    |
| 3,803,583 | 4/1974  | Manber .................. 340/324 AD    |
| 3,893,100 | 7/1975  | Stein .................... 340/336      |

Primary Examiner—Marshall M. Curtis
Attorney, Agent, or Firm—Mawhinney & Mawhinney & Connors

[57] ABSTRACT

Character data is entered into a cathode ray tube display device from a keyboard or from a tape reader or the like selected by a key on the keyboard. The data is stored in a main memory inside the display device and simultaneously displayed on the cathode ray tube for composing and editing. An auxiliary memory is disposed between the display device and output devices such as tape punches so that data may transferred from the main memory of the display device into the auxiliary memory, and the data may be transferred from the auxiliary memory to the output devices while new data is being entered into the display device. Selected characters on the display, such as capitals, may be emphasized by displaying a dotted or solid line above or below the character or slanting the character. A cursor controlled by the keyboard is displayed on the cathode ray tube to indicate the position for entry or editing of data. Warning means are provide to give an indication when the cursor reaches the end of the display. The character keys on the keyboard are used for entering alphanumeric data and symbols, and a subset of the character keys arranged in a "tens key" configuration like a hand calculator keyboard are used for entering both alphanumeric data and the "tens key" functions constituted by digital numbers and mathematical operators. The "tens key" keys are enabled to produce the "tens key" functions and the other character keys inhibited by a selector key on the keyboard. The display may be divided into variable length fields by means of field marks or characters. Data may be inserted at a given point and following data shifted toward the end of the display. A field mark, allowing easy right justification of character sets utilizing the insertion function, terminates the insertion operation when the rightmost character of the set reaches the field mark. A delete function is also provided, in which a selected character is deleted and the following characters shifted toward the beginning of the display to fill inthe blank space created by the deletion of the character. When a field mark is disposed between the deletion location and the end of the display, characters following the field mark will not be shifted.

12 Claims, 13 Drawing Figures

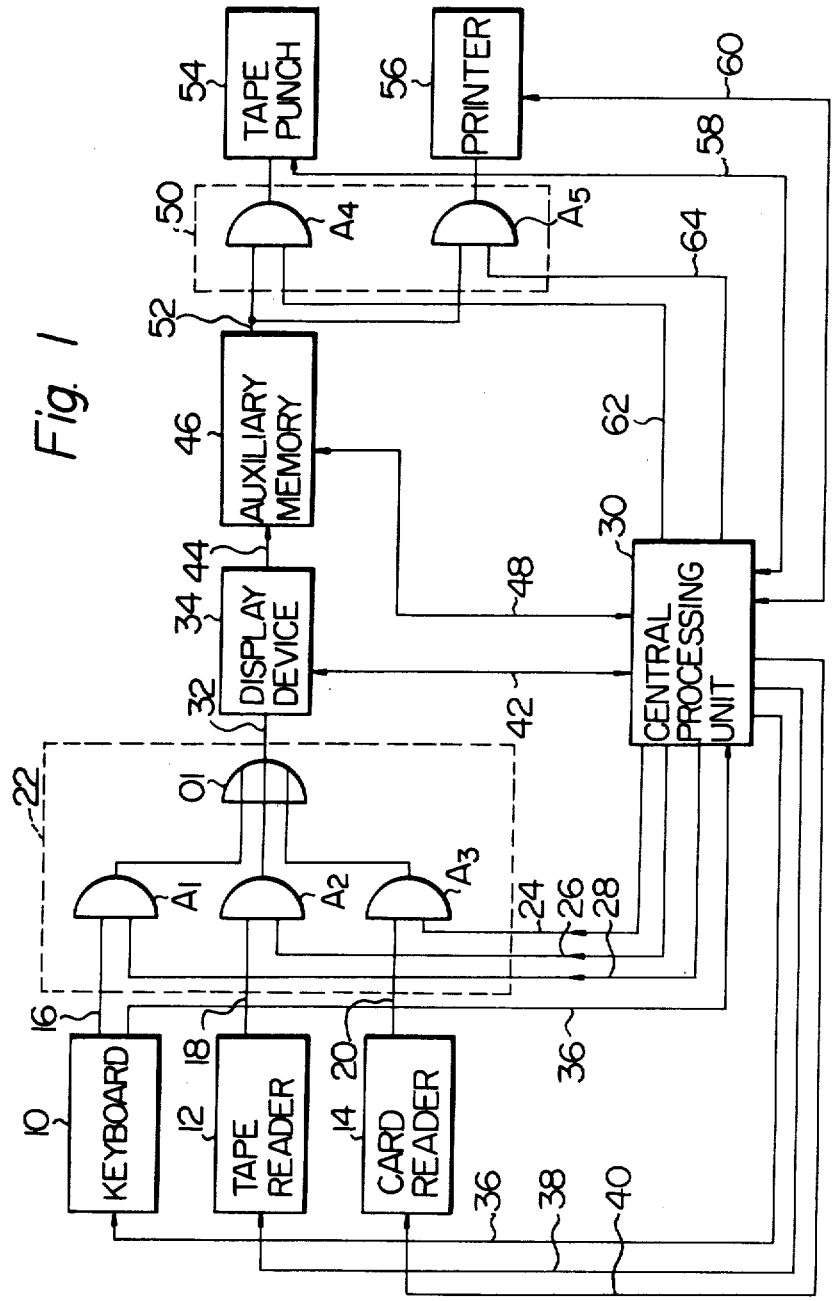

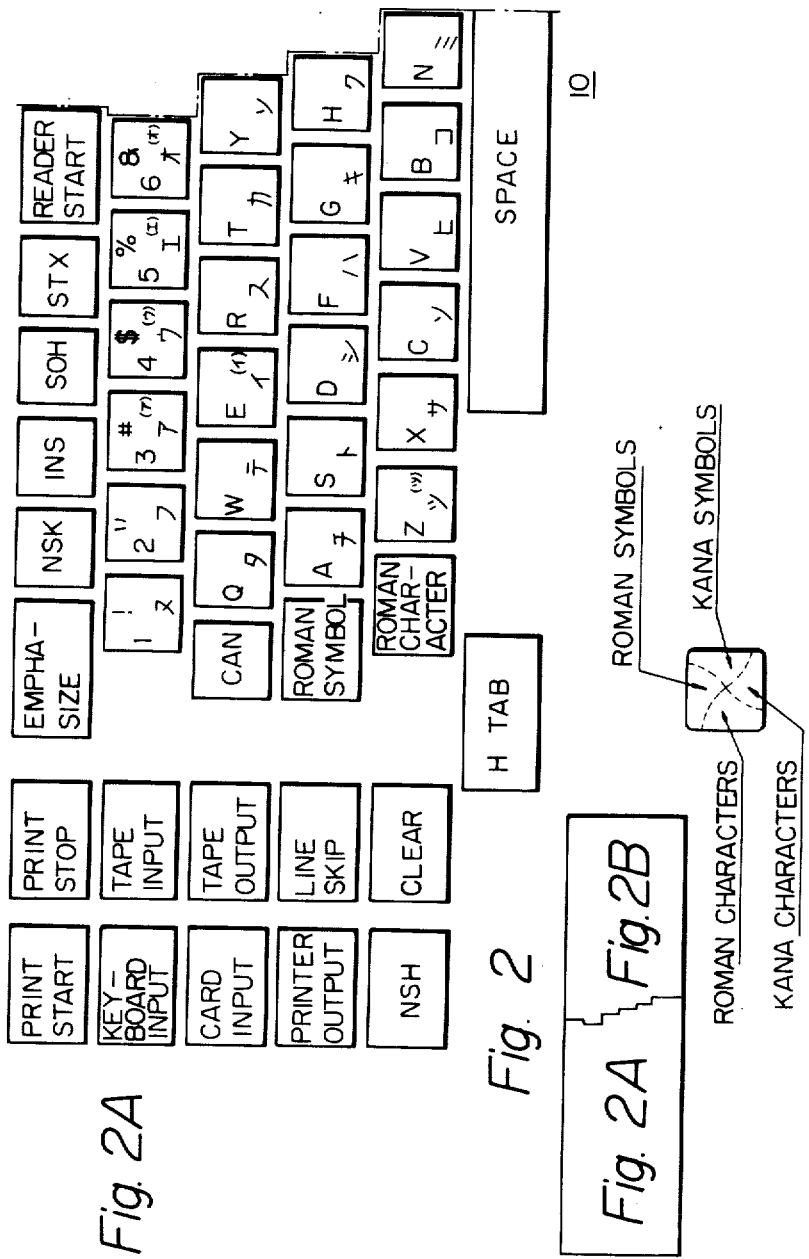

Fig. 3

DATA PROCESSING SYSTEM

The present invention relates to an improved data processing system.

In a data processing system known in the prior art, a keyboard is utilized to enter data into a display device for composing and editing. The display device comprises a memory unit to store the input data and a cathode ray tube to provide a visual display of the data. The data is in the form of Roman or other letters, numbers and symbols. After the data is satisfactorily composed and edited, a transfer key on the keyboard is pressed, and the data is transferred from the memory unit to a tape punch or the like to produce, for example, a paper tape output. A major disadvantage is encountered in such a system, since although the data may be transferred from the memory unit to the tape punch very quickly, the operation of the tape punch is quite slow, and the display unit is tied up for the length of time required for transfer of the data to the tape punch.

Another problem with such a prior art system is that a keyboard controlled cursor provided to indicate the data entry position on the cathode ray tube may, if the keyboard operator does not pay careful attention to the display, run off the end of the display. Depending on the specific construction of the system, if the cursor runs off the end of the display, any data entered after that time will be lost. In another version of the system, the cursor will return to the beginning of the display, and data entered after that time will overwrite the data already entered with the result that the previously entered data is destroyed.

Another drawback in the prior art involves the configuration of the keyboard. In a standard keyboard, the numbers and mathematical symbols indicating, for example, multiplication, division, addition and subtraction are arranged as in a typewriter keyboard, which is a different configuration than that adapted by hand and office calculators. For this reason, an accountant or other operator familiar with a calculator keyboard but not familiar with a typewriter keyboard will experience difficulty in efficiently operating a standard data processing system keyboard. The undesirable consequences of lost time and numerous errors are obvious.

While known data processing systems are provided with insertion and deletion functions for composing and editing data stored in the display device, and also with tabulator functions, the two are not interrelated with each other, and thus insertion or deletion of a character will affect the entire display. Specifically, if a character is inserted, a space will be created between the character preceding the character to be inserted and the character following the character to be inserted, with the characters following the character to be inserted shifted toward the end of the display and the last character overflowed (lost). The character to be inserted is then inserted into the space created. This operation is very troublesome when it is desired to create columns of, for example, numbers, since the columns will be moved by insertion operations. Similarly, in a deletion operation, a specified character is deleted and the following characters are shifted toward the beginning of the display to fill in the blank space, thereby creating a blank space in the last character position of the display. Such a deletion operation is also troublesome for creating columns of numbers, since the entire display is shifted away from the tab set position by either an insertion or deletion operation.

Still another problem with prior art data processing systems of the type described above is that a keyboard of a system adapted to display both Roman letters and Japanese katakana (phonetic) characters is able to display the Roman letters only in the form of capitals. There is no way to distinguish capital letters from small letters in the original information to be processed, and similarly there is no way of emphasizing important data in the display which should receive special attention.

It is therefore an important object of the present invention to provide a data processing system which eliminates the above described drawbacks of the prior art.

It is another important object of the present invention to provide a data processing system comprising an auxiliary memory connected between a display device and an output device by which data stored in the display device may be transferred to the auxiliary memory, and new data entered into the display device while the data in the auxiliary memory is being transferred to the output device.

It is another important object of the present invention to provide a data processing system comprising warning means adapted to provide a warning indication when a cursor of the display device reaches the end of the display.

It is another important object of the present invention to provide a data processing system in which a subset of the character keys of a keyboard is arranged in a "tens key" configuration similar to a calculator keyboard, and in which the subset of the character keys may be used both for entry of "tens key" data and alphanumeric data as controlled by selector keys on the keyboard, the character keys other than the "tens keys" being inhibited when a "tens key" selector key is depressed.

It is another important object of the present invention to provide a data processing system in which field marks or characters may be displayed on the display device to divide the display into a plurality of variable length fields, an insertion or deletion operation being effective only within the respective field.

It is another important object of the present invention to provide a data processing system in which, when a field mark is displayed after a designated location for an insertion function, the insertion function is automatically terminated when the rightmost character of a character set preceding the field mark reaches the position immediately preceding the field mark, thereby enabling simple right justification of character sets using the insertion key of the keyboard to create columns of characters such as numbers.

It is another important object of the present invention to provide a data processing system comprising means for slanting a selected character or displaying a dotted or solid line above or below the selected character to emphasize the character.

It is another important object of the present invention to provide a method of processing data comprising transferring and storing data from a display device in an auxiliary memory, and transferring the data from the auxiliary memory to an output device while new data is being entered into the display device.

It is another object of the present invention to provide a method of processing data in which selected characters are emphasized by making them appear as slanted on a display device.

The above and other objects, features and advantages of the present invention will become clear from the following detailed description taken in conjunction with the accompanying drawings, in which:

FIG. 1 is an overall schematic block diagram of a preferred exemplary embodiment of a data processing system according to the present invention;

FIGS. 2a and 2b are a graphic illustration of a keyboard of the system shown in FIG. 1;

FIG. 3 is a schematic block diagram of a display device of the system shown in FIG. 1;

Figure 2B:
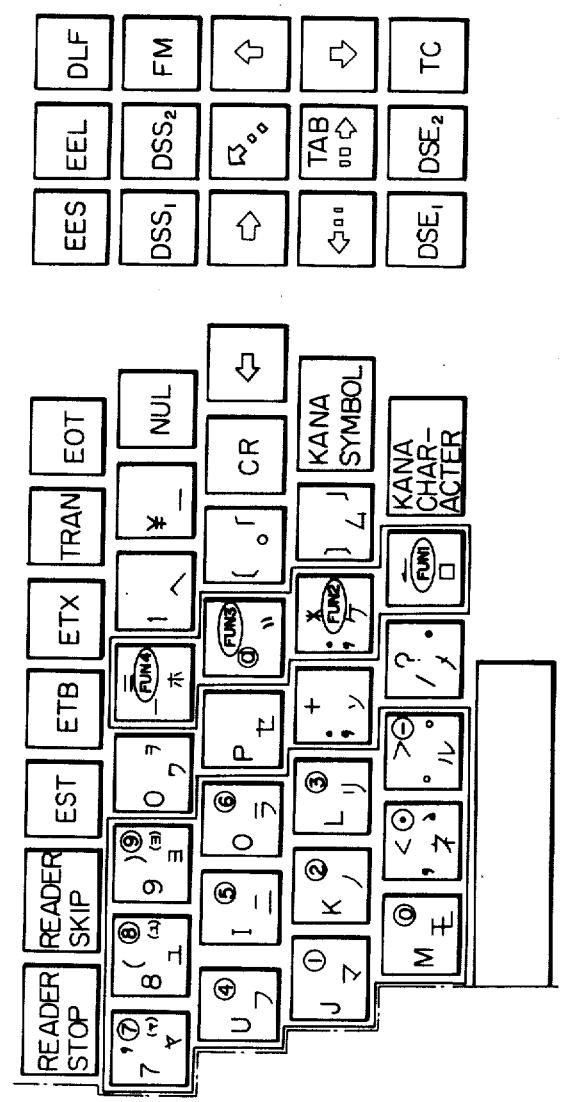

Referring now to FIG. 1, the data processing system comprises a keyboard 10, which will be described in detail below, a conventional paper tape reader 12 and a conventional punched card reader 14. Other input devices such as a magnetic tape or card reader, a teletype receiver or the like may be provided within the scope of the invention although they are not shown. The keyboard 10, tape reader 12 and card reader 14 are adapted to produce at their outputs eight bit binary words corresponding to characters, digital numbers, symbols, instructions and other desired data. The keyboard 10 produces 8 outputs, one for each bit constituting the output words thereof. For simplicity of illustration, only one of the outputs is shown and designated as a line 16. The line 16 from the output of the keyboard 10 is connected to an input of an AND gate A1 of a gate unit 22. It will be understood that 7 additional AND gates identical to the AND gate A1 are provided for the 7 additional bits of the keyboard 10 output data, but are similarly not shown for simplicity of illustration. The output of one bit of the tape reader 12 is designated as a line 18, and is connected to an input of an AND gate A2 of the gate unit 22. The output of one bit of the card reader 14 is designated as a line 20 and connected to an input of an AND gate A3 of the gate unit 22. The outputs of the AND gates A1, A2 and A3 are connected to inputs of an OR gate O1, the output of which is connected to an input of a display device or unit 34 through a line 32. A central processing unit 30 is provided, and receives control signals from keyboard 10 through a line 36. The central processing unit 30 applies control signals to inputs of the AND gates A1, A2 and A3 through lines 28, 26 and 24 respectively. It is understood that the AND gates A1, A2 and A3 and the OR gate O1 are provided in 8 duplicate sets in the actual system to accommodate the 8 bits of the data words respectively. The central processing unit 30 feeds control signals to the keyboard 10, tape reader 12 and card reader 14 through lines 36, 38 and 40 respectively.

Control signals are transferred back and forth between the central processing unit 30 and the display device 34 through a line 42. The output of the display device 34 is connected to the input of an auxiliary memory 46 through a line 44. Control signals are transferred back and forth between the central processing unit 30 and the auxiliary memory 46 through a line 48. The output of the auxiliary memory 46 is connected through a line 52 to inputs of AND gates A4 and A5 of a gate unit 50. Actually, 8 each of the AND gates A4 and A5 are provided to accommodate the 8 bits of each data word. The output of the AND gate A4 is connected to the input of a tape punch 54, and the output of the AND gate A6 is connected to the input of a printer 56. The operation of the tape punch 54 and printer 56 are controlled by the central processing unit 30 by means of control signals transferred back and forth through lines 58 and 60 respectively. Control signals from the central processing unit 30 are fed to inputs of the AND gates A4 and A5 through lines 62 and 64 respectively.

Referring now to FIG. 2, an input keyboard 10 comprises a plurality of keys for entering alphanumeric data, symbols and instructions into the display device 34 and central control unit 30. The character keys in the central portion are in accordance with Japanese Industrial Standards, and the other keys are utilized to control the various units of the data processing system as will be described in detail below. Examination of the insert at the bottom left corner of FIG. 2 will disclose that a single key may be used to enter Roman characters, Roman symbols, Japanese katakana (phonetic) characters and katakana symbols as printed on the left side, top, bottom and right side of the key. Selection is made by depressing a Roman character, Roman symbol, kana character or kana symbol key respectively as shown in the drawing. In addition, the keys enclosed in solid dark lines may be used as "tens keys", and are arranged in the form of a calculator keyboard. This subset of the character keys shown will produce only digital numbers and four mathematical functions such as multiplication, division, addition and subtraction (designated as FUN1, FUN2, FUN3 and FUN4). The tens key mode is selected by depressing a NSH key shown in FIG. 2, and the tens keys will produce the characters and functions enclosed in circles and printed on the respective keys. Depression of any other key in the tens key mode will produce no effect.

Figure 3:
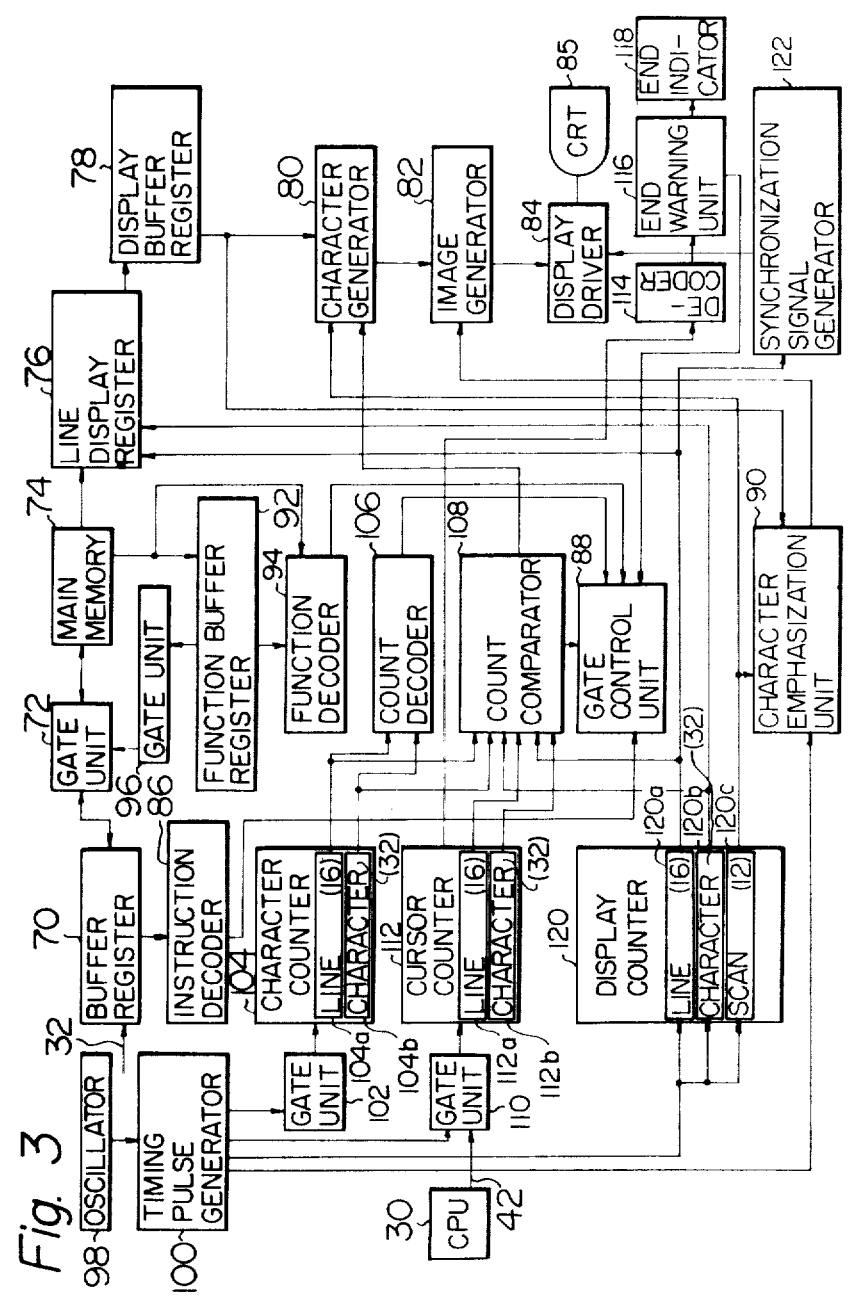

A block diagram of the display unit 34 is shown in FIG. 3. The output of the 8 OR gates designated as the single OR gate O1 are fed in parallel into the stages of an 8 bit buffer register 70 respectively. The stages of the buffer register 70 are fed in parallel through a gate unit 72 to the inputs of 8 shift registers respectively of a main memory 74. A cathode ray tube 85 of the display device 34 is adapted to display 512 characters (words) of data in the form of 16 lines of 32 characters each. For this reason, the main memory 74 comprises 8 shift registers, each having a capacity of 512 bits, although all of the shift registers are not shown for simplicity of illustration. The shift registers are shiftable in parallel so that the respective data words (8 bits) remain in alignment. In addition, the outputs of the shift registers may be connected to the inputs thereof in a cyclic arrangement as will be described in detail below.

The outputs of the last 32 stages of the shift registers of the main memory 74 are connected in parallel to the stages of 8 shift registers of a line display register 76, each of the shift registers (not shown) having a capacity of 32 bits and their outputs connected to their inputs in a cyclic arrangement. In this way, the lines (32 characters) of data may be stored in their entirety in the line display register 76 one line at a time.

The outputs of the shift registers of the line display register are connected in parallel to the inputs of an 8 bit display buffer register 78, the outputs of which are connected in parallel to the inputs of a character generator 80. The outputs of the character generator 80 are connected to the inputs of an image generator 82, the outputs of which are connected to an input of a display driver 84. A video output of the display driver 84 is connected to a video input (not designated) of the cathode ray tube 85.

The stages of the buffer register 70 are connected in parallel to the inputs of an instruction decoder 86, the output of which is connected to the input of a gate control unit 88. The gate control unit 88 is operative to control the operation of various gate units as will be described in detail below. The outputs of the shift registers of the main memory 74 are connected in parallel to inputs of an 8 bit function buffer register 92 and a function decoder 94. The output of the function buffer register 92 is connected to another input of the function decoder 94 and through a gate unit 96 to the input of the main memory 74. The output of the function decoder 94 is applied to the gate control unit 88.

A high frequency oscillator 98 is adapted to oscillate at 11.8 MHz and feed its output to a timing pulse generator 100. The timing pulse generator 100 frequency divides and gates the 11.8 MHz signal from the high frequency oscillator 98 to produce at its outputs a number of timing signals which will be described in detail below. One of said timing signals is fed through a gate unit 102, which is controlled by the gate control unit 88, to the count input of a character counter 104. The character counter 104 is arranged to count from 1 to 512 (the number of characters to be displayed) in terms of the line and row (character) number of the character on the cathode ray tube 85. The character counter 104 therefore comprises a line counter 104a arranged to count from 1 to 16 and a character counter 104b arranged to count from 1 to 32. The outputs of the line and character counters 104a and 104b respectively of the character counter 104 are fed to inputs of a count decoder 106 and a count comparator 108, outputs of which are connected to control inputs of the gate control unit 88.

Other timing signals from the timing pulse generator 100 are fed through a gate unit 110 controlled by the central processing unit 30 by means of the line 42 to the count input of a cursor counter 112. The cursor counter 112, in an arrangement similar to the character counter 104, comprises a line counter 112a adapted to count from 1 to 16 and a character counter 112b adapted to count from 1 to 32. The outputs of the line and character counters 112a and 112b respectively of the cursor counter 112 are fed to inputs of the count comparator 108. Another output of the count comparator 108 is fed to the input of the character generator 80. Another timing signal output of the timing pulse generator 100 is fed to an input of a character emphasization unit 90. The output of the character emphasization unit 90 is applied to a control input of the image generator 82, and the output of the display buffer register 78 is applied to another input of the character emphasization unit 90.

Another output of the cursor counter 112 is fed to an input of a decoder 114, the output of which is fed to an input of an end warning unit 116. Outputs of the end warning unit 116 are fed to an end indicator 118, which may be a light, buzzer, beeper or other suitable indication means, and to the gate control unit 88.

The display unit 34 further comprises a display counter 120 connected to receive timing signals from the timing pulse generator 100. The display counter 120 comprises, similar to the character and cursor counters 104 and 112 respectively, a line counter 120a and a character counter 120b. The output of the line counter 120a of the display counter 120 is connected to inputs of the count comparator 108, the line display register 76 and a synchronization signal generator 122. The output of the character counter 120b of the display counter 120 is connected to inputs of the count comparator 108 and the line display register 76. The display counter 120 further comprises a scan counter 120c operative to count from 1 to 12. The output of the scan counter 120c of the display counter 120 is connected to a control input of the character generator 80.

Figure 4:
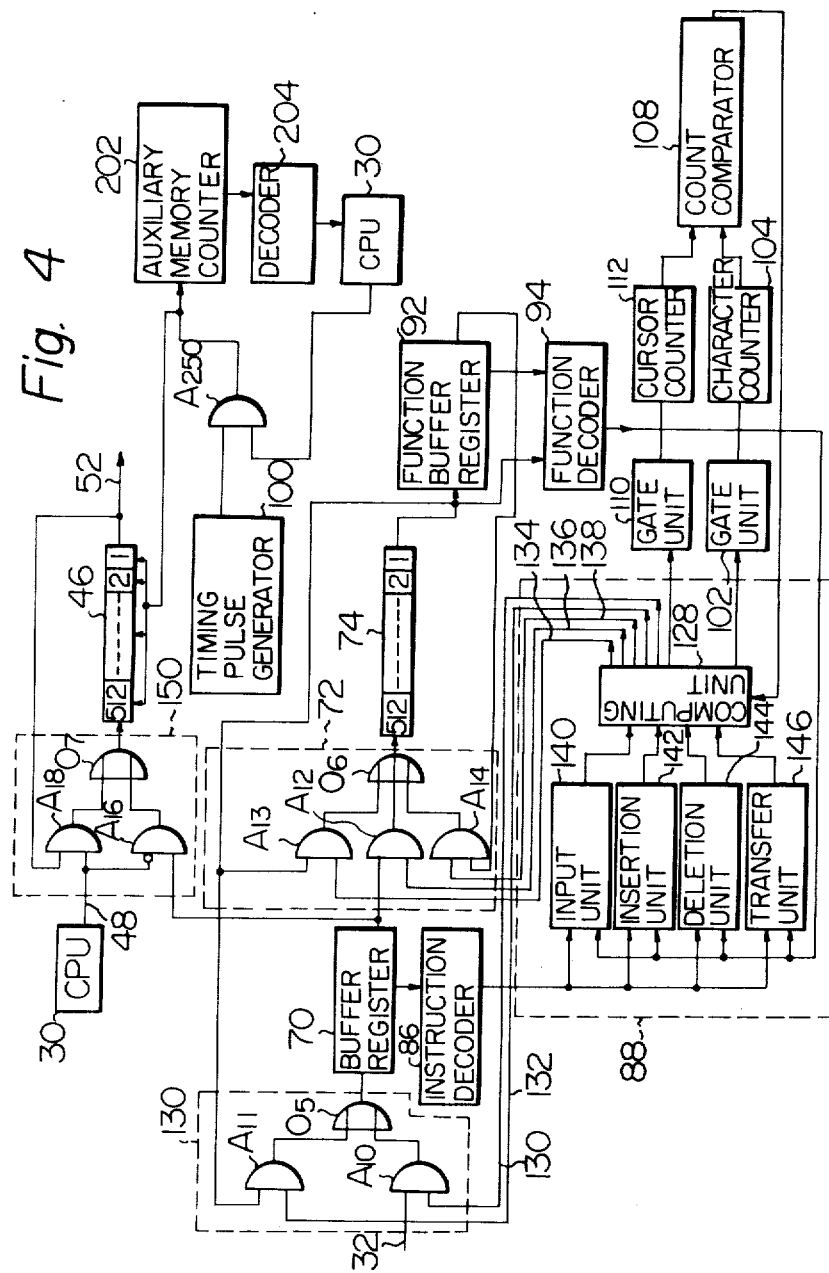
FIG. 4 is a schematic block diagram illustrating data transfer and editing functions of the system shown in FIG. 1.

Referring now to FIG. 4, the display device 34 and the auxiliary memory 46 are shown in greater detail. In the drawing, the line 32 from the OR gate O1 of the gate unit 22 is connected to an input of an AND gate A10 of a gate unit 130. The output of the AND gate A10 is connected to an input of an OR gate O5, the output of which is connected to the input of the buffer register 70. The gate unit 72 is shown as comprising an AND gate A12. The output of the buffer register 70 is connected to an input of the AND gate A12. The output of the AND gate A12 is connected to an input of an OR gate O6, the output of which is connected to the input of the main memory 74. The output of the main memory 74 is connected to inputs of an AND gate A11, an AND gate A13, the function buffer register 92 and the function decoder 94. The output of the AND gate A11 is connected to an input of the OR gate O5. The output of the function buffer register 92 is connected to an input of an AND gate A14. The outputs of the AND gates A13 and A14 are connected to inputs of the OR gate O6. The gate control unit 88 comprises a computing unit 128, control outputs of which are connected to the AND gates A10, A11, A12, A13 and A14 through lines 130, 132, 136, 134 and 138 respectively.

The outputs of the instruction decoder 86 and the function decoder 94 are connected to respective inputs of an input unit 140, an insertion unit 142, a deletion unit 144 and a transfer unit 146 constituting parts of the gate control unit 88. The outputs of the units 140, 142, 144 and 146 are connected to inputs of the computing unit 128.

Outputs of the computing unit 128 are connected to inputs of the gate units 110 and 102 to control the application of timing signals to the cursor counter 112 and the character counter 104 respectively. The output of the count comparator 108 is connected to an input of the computing unit 128.

The output of the buffer register 70 is connected to an input of an AND gate A16 constituting part of a gate unit 150. The output of the AND gate A16 is connected to an input of an OR gate O7, the output of which is connected to the input of the auxiliary memory 46. The output of the auxiliary memory 46 is connected to the line 52 leading to the gate unit 50 and also to an input of an AND gate A18. The output of the AND gate A18 is connected to an input of the OR gate O7. An output of the central processing unit 30 is connected to an input of the AND gate A18 and to an inverting input of the AND gate A16. Whereas timing signals from the timing pulse generator 100 are applied directly and continuously to the shift inputs of the main memory 74, timing signals are applied from the timing pulse generator 100 to the input of an AND gate A250, the output of which is connected to the shift inputs of the auxiliary memory 46 and the count input of an auxiliary memory counter 202. An output of the central processing unit 30 is connected to another input of the AND gate 250.

The output of the auxiliary memory counter 202 is connected to the input of a decoder 204, the output of which is fed to the central processing unit 30.

The construction of the auxiliary memory 46 is essentially identical to that of the main memory 74, in that the auxiliary memory comprises 8 parallel shift registers of 512 bits each. As described with reference to FIG. 1, 8 each of the shift registers of the main and auxiliary memories 74 and 46 and the gate units 130, 150 and 72 are provided, although only one each is shown for simplicity of illustration.

Other sections of the data processing system will be described in detail below. The operation of the data processing system will now be described with reference to the drawings.

DISPLAY OPERATION

It will be assumed that the data representing 512 characters has been stored in the main memory 74. The computing unit 128 generates a logically high output to enable the gate unit 102 so that timing pulses from the timing pulse generator 100 are continuously gated through the gate unit 102 to the character counter 104. During the data input operation which will be described in detail below, the character counter 104 was reset to the count of one as the first character was read in so that when the count of the character counter 104 reaches 512, the first character is in the last stage of the main memory 74 constituting the output thereof. Timing pulses from the timing pulse generator 100 shift the shift registers of the main memory 74 and increment the character counter 104 in synchronism. Referring to FIG. 4, the computing unit 128 feeds logically low signals to the inputs of the AND gates A12 and A14 and a logically high signal to the input of the AND gate A13 so that the output of the main memory 74 is fed back to its input (recirculated) through the AND gate A13.

As the count of the character counter 104 returns to 1 after reaching the maximum count of 512, it will be understood that the counts in both the line and character counters 104a and 104b of the character counter 104 will become one. This is detected by gates (not shown) in the line display register 76, and the characters occupying the last 32 positions in the main memory 74 (the first line of the display) are transferred in parallel to the line display register 76. The main memory 74 is then shifted 32 times so that the second 32 characters (the second line of the display) occupy the last 32 positions in the main memory 74.

Simultaneously with the shifting of the main memory 74, the display counter 120 is incremented by much higher frequency pulses as will be described in detail below, and actuates the synchronization signal generator 122 to generate horizontal (line) and vertical (frame) sweep signals to create a raster pattern on the cathode ray tube 85.

Figure 10:
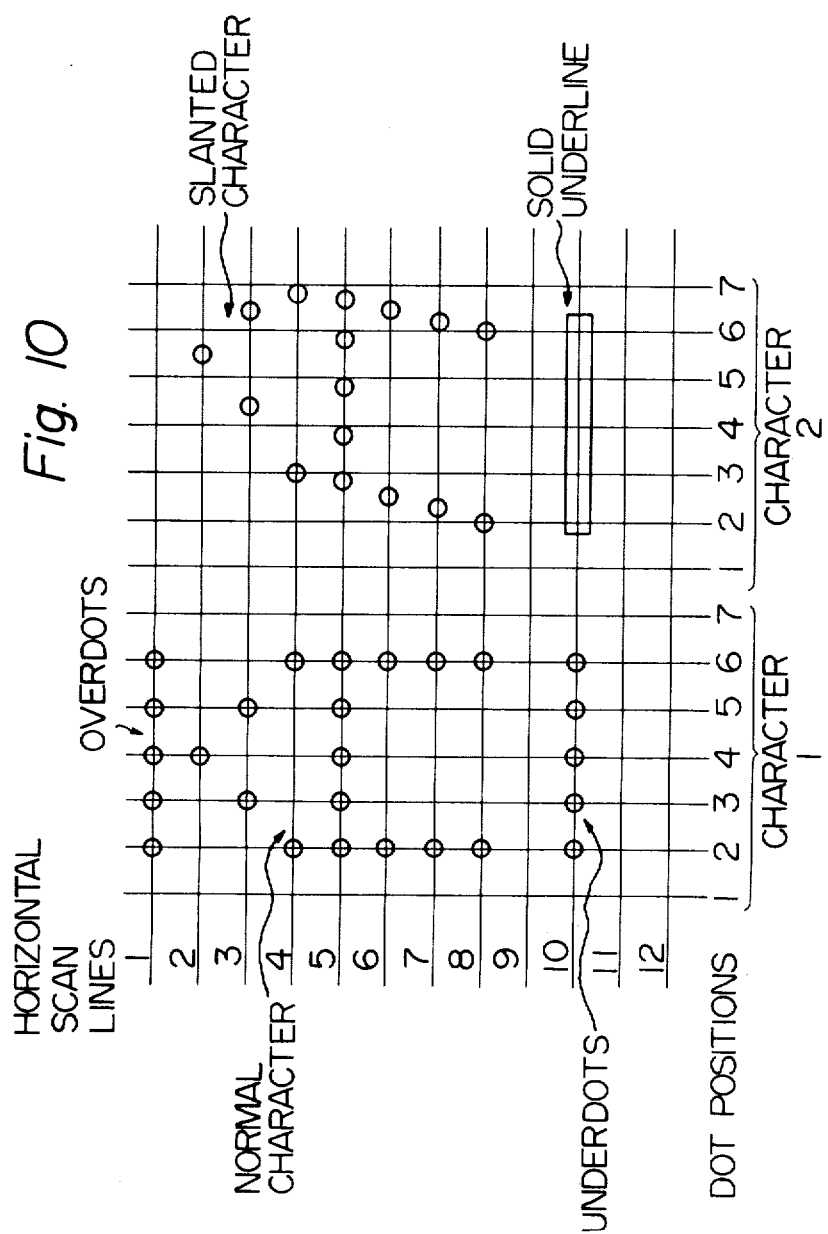
FIG. 10 is a graphic illustration of the operation of means to emphasize selected characters of the display by displaying a dotted or solid line above or below the selected character or slanting the character.

Referring now to FIG. 10, it will be seen that the characters are displayed on the cathode ray tube 85 in the quantized form of lines, each line being subdivided into a plurality of illuminatable points or dots. The dots are indicated by circles in the drawing. The horizontal lines represent the scan or raster lines of the cathode ray tube 85, and 12 raster lines are provided for each line of characters. Of these 12 raster lines, the first or top line may either be blank or display an overhead dotted line (overdots) as will be described in detail below. The 2nd through 8th lines are used to display the characters themselves, the 9th line is blank. The 10th line may either be blank or display a solid or dotted underline (underdots) or a cursor. The 11th and 12th lines are blank.

As for the illuminatable points or dots, the vertical lines in FIG. 10 illustrate the normal positions of the dots, which are produced by intensity modulating the beam of the cathode ray tube 85. Seven dot positions are provided for each character. The first (leftmost) dot position is blank to provide a space between adjacent characters. The 2nd through 6th dot positions are used for the character themselves. The 7th dot position is blank. In this manner, a character is displayed by selectively illuminating a plurality of a possible 35 points (7 vertical by 5 horizontal), as shown by the leftmost character "A" in FIG. 10.

Referring back to FIGS. 1, 2 and 3, it will be recalled that the first line of characters has been transferred to the line display register 76. In synchronism with the generation of the first scan line by the synchronization signal generator 122, the first character is transferred to the display buffer register 78. The output of the display buffer register 78 is applied to the character generator 80. The output of the scan counter 120c of the display counter 120 is applied to gates (not shown) of the character generator 80. The count of the scan counter 120c is one, indicating the first scan line (top scan line) of the characters of the first line of characters. In response to the count of one in the scan counter 120c and the first character of the line, the character generator 80 produces at its outputs the dot pattern of the first scan line of the first character. In this case, since the first line is blank, the outputs of the character generator 80 will all be zero.

The remainder of the first line scanning operation will not be described since no display is produced. The scanning of the second line is identical to that of the first line, and since a display is produced, it will be described in detail.

Upon completion of the first scanning operation (first scan line), the counts of the line and character counters 120a and 120b of the display counter 120 reach their maximum values and return to counts of one. The count in the scan counter 120c of the display counter 120 is incremented to 2 indicating that the second scan (raster) line of the first line of characters is to be produced. The first character is transferred from the line display register 76 to the display buffer register 78. The output of the display buffer register 78 (an 8 bit word designating the character) is applied to the character generator 80 which produces 5 outputs (only one is shown for simplicity of illustration) corresponding to the pattern of the dots of the top line of the character. In the case of the character "A" shown in FIG. 10, the center output of the character generator 80 will be logically high whereas the other outputs will be logically low.

The outputs of the character generator 80 are applied to the inputs of the image generator 82. Seven timing or "dot" pulses from the timing pulse generator 100 are then applied to image generator 82 through the character emphasization unit 90. In response to these dot pulses, the image generator 82 provides signal outputs which sequentially correspond to the dot pattern of the top scan line of the first character. For this character "A", the first output of the image generator 82 is zero, since the first dot position of each character is blank. The 2nd and 3rd outputs are also zero, because the 2nd and 3rd dot positions are not illuminated to produce the character "A". The 4th output of the image generator 82 is high, corresponding to the apex of the character "A". The 5th and 6th outputs of the image generator 82 are zero. The seventh output of the character generator 82 is also zero, since the 7th dot position is always blank. The output of the image generator 82 is fed to the video input (not shown) of the cathode ray tube 85 through the display driver 84 to intensity modulate the electron beam and display the top scan line of the first character of the display.

Figure 5:
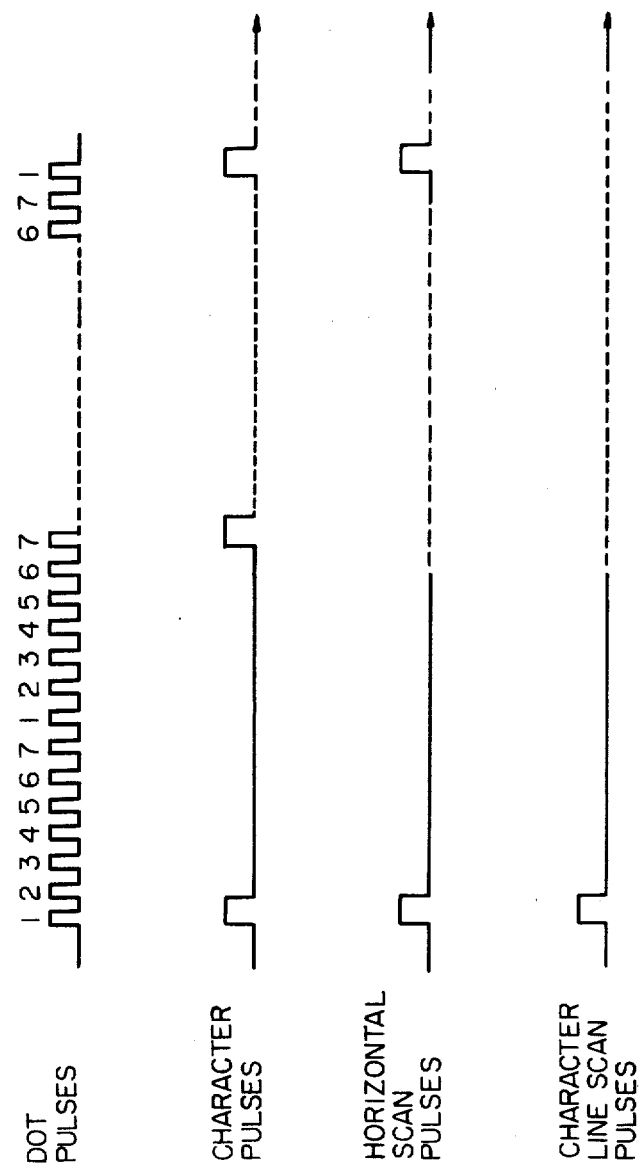
FIG. 5 is a timing chart of signals utilized by the display device shown in FIG. 3.

In synchronism with the 8th dot pulse, a timing pulse is applied to the character counter 120b of the display counter 120 incrementing the count therein to two, designating the second character of the first line of characters. This causes the line display register 76 to shift and transfer the second character to the display buffer register 78. The display buffer register 78 applies the bit pattern of the second character to the character register 80, which produces at its outputs the pattern of the top line of the second character. This output is applied to the image generator 82 along with 7 dot pulses to display the top scan line of the second character. As shown in FIG. 5, the timing pulse generator 100 generates one timing pulse to increment the character counter 120b of the display counter 120 for each 7 dot pulses. For each scan or raster line, the timing pulse generator 100 generates 32 pulses to increment the line counter 120a of the display counter 120. It will therefore be clear that for each scan line, the line display register 76 is shifted 32 times to output the 32 character of the line stored therein sequentially to the character generator 80 and display the scan line of the 32 characters on the cathode ray tube 85. After the completion of one scan line, the first character again appears at the output of the line display register 76.

In synchronism with the beginning of the 3rd line scanning operation, the timing pulse generator 100 applies a timing pulse to the input of the scan counter 120c of the display counter 120 incrementing the count therein to 3 designating the third scanning line of the first line of characters. The output of the scan counter 120c is applied to the character generator 80 to generate the third line of the line of characters. The line display register 76 is shifted 32 times to sequentially generate the 32 characters of the first line of characters. In the case of the character "A", the first 2 outputs of the image generator 82 will be zero, the 3rd output high, the 4th output zero, the 5th output high and the 6th and 7th outputs zero.

After the 12 scanning lines of the first line of characters have been displayed, the timing pulse generator 100 applies a timing pulse to the line counter 120a of the display counter 120 to increment the count thereof to two, designating the second line of characters. From the above description, it will be recalled that the main memory 74 has been shifted 32 times during the scanning operation described so that the second 32 characters (the second line of the display) occupy the last 32 positions in the main memory 74. In response to the count of 2 in the line counter 120a, the contents of the last 32 locations of the main memory 74 are transferred in parallel to the line display register 76. The above described operations are repeated in an identical manner to display the 16 lines of characters.

DATA INPUT OPERATION

To enter data from the keyboard 10, the CLEAR key thereof is depressed to reset the various counters as will be described below and feed a keyboard entry mode signal or "clear" signal to the central processing unit 30. The central processing unit 30 generates logically low signals on the lines 38, 40, 24, 26, 58, 60, 62 and 64 to inhibit the tape reader 12, card reader 14, tape punch 54 and printer 56. The central processing unit 30 further feeds a logically high signal through the line 28 to enable data entry into the display device 34 through the AND gate A1. The clear signal is also fed from the central processing unit 30 to the computing unit 128 of the display device 34 through the line 42, and the computing unit 128 also generates logically low signals on the lines 132, 136 and 138 to inhibit the AND gates A11, A12 and A14 respectively. The computing unit 128 feeds a logically high signal to the AND gate A10 through the line 130 to enable the AND gate A10. The computing unit 128 also feeds a logically high signal to the AND gate A13 so that the contents of the main memory 74 will be recirculated therethrough.

When the CLEAR key is depressed, a clear code signal (8 bits) is generated and is applied through the AND gate A1, OR gate O1, AND gate A10 and OR gate O5 to the buffer register 70 and stored therein. The instruction decoder 86 decodes the clear code, and applies a signal to the input unit 140 to actuate the same. The input unit 140 applies a signal to the computing unit 128 to enable a data entry operation.

The clear signal applied to the central processing unit 30 has the effect of resetting the cursor counter 112, the display counter 120 and the auxiliary memory counter 202 to the count of 1. It will be recalled that the character counter 104 is continuously incremented in synchronism with the shifting of the registers of the main memory 74.

To enter the first character, a character key is depressed to enter, for example, the character "A". The 8 bit code for the character "A" is fed through the gate units 22 and 130 in a manner similar to the clear code and stored in the buffer memory 70, overwriting the clear code. The instruction decoder 86 decodes the contents of the buffer register 70 as designating a character rather than an instruction, and feeds a signal indicating the same to the input unit 140 which in turn applies a signal to the computing unit 128. When the count of the character counter 104 reaches 1 (becomes equal to the count in the cursor counter 112), the count comparator 108 feeds a signal to the computing unit 128, which in turn generates a logically high signal on the line 136 to enable the AND gate A12 and a logically low signal on the line 134 to inhibit the AND gate A13. The data representing the character "A" is then gated through the AND gate A12 and OR gate O6 from the buffer register 70 to the input of the main memory 74 and stored in the first location in the main memory 74. As the count in the character counter 104 becomes 2, indicating that the character "A" is being shifted to the second location in the main memory 74, the count comparator 108 terminates its output signal, and the computing unit 128 applies a logically low signal on the line 136 to the AND gate A12 to inhibit the same and prevent further entry of data into the main memory 74. The computing unit 128 also applies a logically high signal on the line 134 to resume recirculation of the data through the main memory 74.

When it is desired to enter data from the tape reader 12, the operator depresses the TAPE INPUT key on the keyboard 10. This has an effect similar to the clear signal, but the central processing unit 30 generates signals to inhibit the AND gates A1 and A3 and enable the AND gate A2 so that data may be entered therethrough from the tape reader 12. To energize the tape reader 12, the READER START key on the keyboard 10 is depressed, which feeds a signal to the central processing unit 30 which in turn feeds a signal through the line 38 to energize the tape reader 12. The tape reader 12 will then continue to feed data into the display device 34 until the READER STOP key on the keyboard 10 is depressed or the instruction decoder 86 senses the end of the data.

The card reader 14 is utilized in an essentially similar manner by depressing the CARD INPUT key on the keyboard 10 followed by the READER START key. The central processing unit 30 will energize the card reader 14 through the line 40 and enable the AND gate A3.

As a character is entered into the main memory 74, the gate control unit 128 feeds a signal to the gate unit 110 to allow one timing pulse to be gated therethrough to increment the cursor counter 112. Whenever the count in the cursor counter 112 is equal to that in the character counter 104, the data point in the main memory 74 which will occupy the position on the display indicated by the cursor occupies the first memory location (at the input) of the main memory 74. It is at this time that the counter comparator 108 produces its output and the data entry operation is performed.

Although now shown herein in detail, many modifications well known in the art may be made within the scope of the present invention to increase the flexibility of the data entry operation. For example, a program may be punched on a tape, which is read into the display device 34 by the tape reader 12. The program may comprise an instruction to stop the tape input operation temporarily to allow data input from the keyboard 10. Control may be automatically restored to the tape reader 12 after the required data is correctly entered through the keyboard 10. Such a system is especially useful in the preparation of bills and form letters, where only such data as a person's name and various accounting information differs for the individual, the rest of the form letter being the same. The opposite operation may also be provided, in which an operator, after entering various data from the keyboard 10, may temporarily shift control to the tape reader 12. Control may be automatically shifted back to the keyboard 10 is desired after the desired data is input from the tape reader 12.

CURSOR MOVEMENT AND DISPLAY END WARNING

A cursor, in the form of a dotted or solid line above or below a character is displayed on the cathode ray tube 85 to indicate the position on the display for data entry or editing, as shown in FIG. 10. Referring briefly to FIG. 3, it will be seen that the outputs of both the cursor counter 112 and the display counter 120 are connected to inputs of the count comparator 108. The count comparator 108 is further operative to feed a signal to the character generator 80 when the counts in the cursor and display counters 112 and 120 respectively are equal. At this time, the character in the cursor indicated position is being displayed, and the character generator 80 is enabled by the signal form the count comparator 108 to generate the cursor display.

Figure 6:
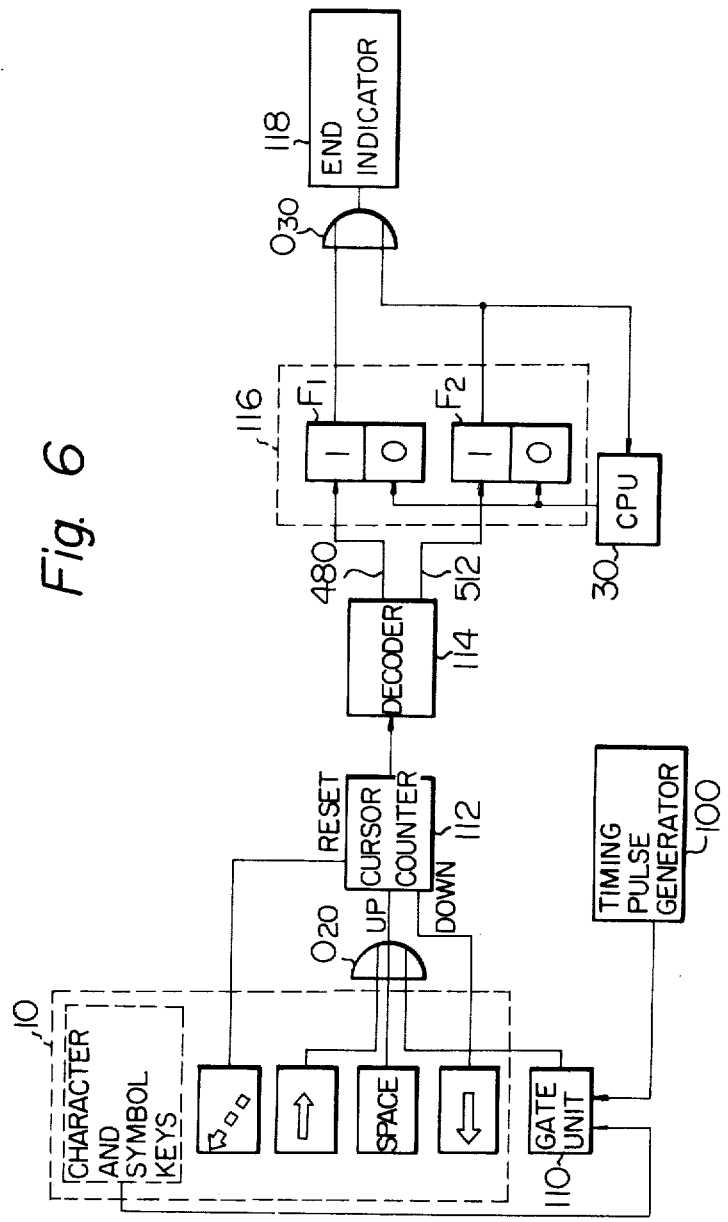
FIG. 6 is a schematic block diagram illustrating the operation of a cursor position selection circuit and a cursor display end warning circuit of the display unit shown in FIG. 3.

Referring now to FIG. 6, a block diagram of the circuitry for moving the cursor is provided. When the key of the keyboard 10 in the form of an arrow pointing in an upper leftward direction is depressed, a signal is applied to a reset input of the cursor counter 112 to reset the count to 1 and move the cursor to the upper leftmost (first) position of the display. When any character or symbol key is depressed, a signal is gated through an OR gate O20 to the up-count input of the cursor counter 112 to increment the cursor counter 112 and move the cursor forward by one space. This is because a timing pulse is gated through the gate unit 110 as described hereinabove. The same effect is produced by depressing a key designated by an arrow pointing rightward or the SPACE key. Depression of a key designated by an arrow pointing leftward (backspace) will apply a signal to the down-count input of the cursor counter 112 to move the cursor backward by one space. Although now described in detail, circuitry may be provided which is well known in the art to move the cursor upward or downward by one line, to the first position of the same or the next line, or to a tabulator selected position.

The output of the cursor counter 112 is applied to the decoder 114, which in the exemplary embodiment shown is adapted to detect the counts of 480 and 512 in the cursor counter 112. The count of 480 corresponds to the last character position of the 15th line, and the count of 512 corresponds to the last character position in the last or 16th line. If desired, the decoder 114 may be adapted to detect any other counts in the cursor counter 114 indicating that the cursor designated position is near the end of the display. The end warning unit 116 comprises two flip-flops F1 and F2. When the decoder 114 detects the count of 480 in the cursor counter 112, it generates a signal on a line designated by the reference numeral 480, which is connected to the "1" side input of the flip-flop F1. Similarly, when the decoder 114 detects the count of 512 in the cursor counter 112, it feeds a signal on a line 512 to the "1" side input of the flip-flop F2.

An output of the central processing unit 30 is connected to the "0" side inputs of the flip-flops F1 and F2, and feeds a signal thereto to reset the flip-flops F1 and F2 at the beginning of a data entry operation. The outputs of the "1" sides of the flip-flops F1 and F2 are connected through an OR gate O30 to an input of the end indicator 118. The "1" side output of the flip-flop F2 is further connected to an input of the central processing unit 30 to prevent data entry after the 512th character.

In operation, when the cursor reaches the end of the 15th line, the decoder 114 generates a signal to set the flip-flop F1 so that the resulting logically high "1" side output is applied to the end indicator 118 to produce a temporary audible or visual warning. When the cursor reaches the end of the 16th line (last data position), the decoder 114 generates a signal to set the flip-flop F2 and again energize the end indicator 118. The second energization of the end indicator 118 may be either temporary or continue unit the data entry operation is terminated by the operator. It will be understood that the decoder 114 may detect one or a plurality of cursor positions near the end of the display as desired, and that the provision of inhibiting data entry after the flip-flop F2 is set is optional. It will also be understood that the circuitry shown in FIG. 6 is operable even if a tabulator or field mark (not shown) is provided in the 480th or 512th position since the cursor is moved by incrementing the cursor counter 112.

DATA TRANSFER OPERATION

After the required data has been satisfactorily edited and stored in the main memory 74, the operator presses the TRAN key on the keyboard 10 to transfer the data to the auxiliary memory 46 and therefrom to a selected output device. It will be assumed that it is desired to punch the data out on paper tape using the tape punch 54. Prior to pressing the TRAN key, the operator presses the TAPE OUTPUT key to select the tape punch 54. A signal is transferred to the central processing unit 30 through the line 36, which in turn feeds a logically high signal over the line 62 to the AND gate A4 to enable the same and a logically negative signal over the line 64 to the AND gate A6 to inhibit the same. The decoder 204 is operative to detect the count of 1 in the auxiliary memory counter 202 and feed a signal to the central processing unit 30 in response thereto. The central processing unit 30 feeds a logically low signal to the AND gate 250 to inhibit the same and maintain the count of one in the auxiliary memory counter 202.

When the TRAN key is depressed, the transfer unit 146 controls the computing unit 128 to render the AND gates A13, A12 and A14 enabled, inhibited and inhibited respectively so that the data is circulated through the main memory 74. The computing unit 128 also renders the AND gates A11 and A10 enabled and inhibited respectively so that data from the output of the main memory 74 is simultaneously applied to the input of the main memory 74 and stored in the buffer register 70. The central processing unit 30 produces a logically low signal on the line 48 to enable and inhibit the AND gates A16 and A18 respectively so that data from the buffer register 70 may be applied to the auxiliary memory 46 through the AND gate A16. When the count in the character counter 104 reaches the count of 1 as detected by the count decoder 106, the central processing unit 30 feeds a logically high signal to the AND gate A250 to enable the same, and identical timing pulses are fed to the shift input of the auxiliary memory 46, the count input of the auxiliary memory counter 202, the shift input of the main memory 74 and the count input of the character counter 104. The main and auxiliary memories 74 and 46 are shifted in synchronism, and the contents of the main memory 74 are sequentially gated to the input of the auxiliary memory 46 through the AND gate A16. When the count in the auxiliary memory counter 202 again reaches one, the decoder 204 feeds a signal to the central processing unit 30 which feeds a logically high signal to the AND gates A16 and A18 to inhibit and enable the same respectively so that the contents of the auxiliary memory 46 may be recirculated through the AND gate A18. The central processing unit 30 further feeds a logically low signal to the AND gate A250 to inhibit the same and prevent shifting of the auxiliary memory 46 and incrementing of the auxiliary memory counter 202.

After the decoder 204 detects the count of one in the auxiliary memory counter 202, the central processing unit 30 feeds a signal over the line 58 to energize the tape punch 54. Although not shown for simplicity of illustration, the tape punch 54 feeds back shift pulses over the line 58 which are applied to the auxiliary memory 46 and auxiliary memory counter 202 to shift the auxiliary memory 46 and increment the auxiliary memory counter 202 in synchronism with the punching operation of the tape punch 54. When the count in the auxiliary memory counter 202 again reaches one, the central processing unit 30 de-energizes the tape punch 54 and inhibits further shifting of the auxiliary memory 46 and incrementing of the auxiliary memory counter 202.

The transfer operation utilizing the printer 56 is essentially similar to that described above with reference to the tape punch 54. In this case, PRINTER OUTPUT key of the keyboard 10 is depressed and the AND gate A6 is enabled.

It will be noticed that after the data is transferred from the main memory 74 to the auxiliary memory 46, the central processing unit 30 feeds a logically positive signal to the AND gates A16 and A18 to break the connection between the main memory 74 and the auxiliary memory 46. If, after the transfer operation, it is desired to punch out another copy of the data stored in the auxiliary memory 46, a PRINT START key on the keyboard 10 is depressed, and the operation of transferring the data from the auxiliary memory 46 to the tape punch 54 will be repeated. As many copies as desired may be easily produced simply by repeatedly depressing the PRINT START key.

A key feature of the present invention lies in the fact that the data stored in the auxiliary memory 46 may be transferred to the tape punch 54 or printer 56 while new data is being entered into the display device 34. This is apparent because the connection between the display device 34 and the auxiliary memory 46 is broken during the transfer operation. This greatly reduces the time required to operate the data processing system, since all of the data may be transferred from the main memory 74 to the auxiliary memory 46 in about 400ms, whereas a number of seconds is required to punch out the data on tape.

CHARACTER SELECTION OPERATION

Figure 9:
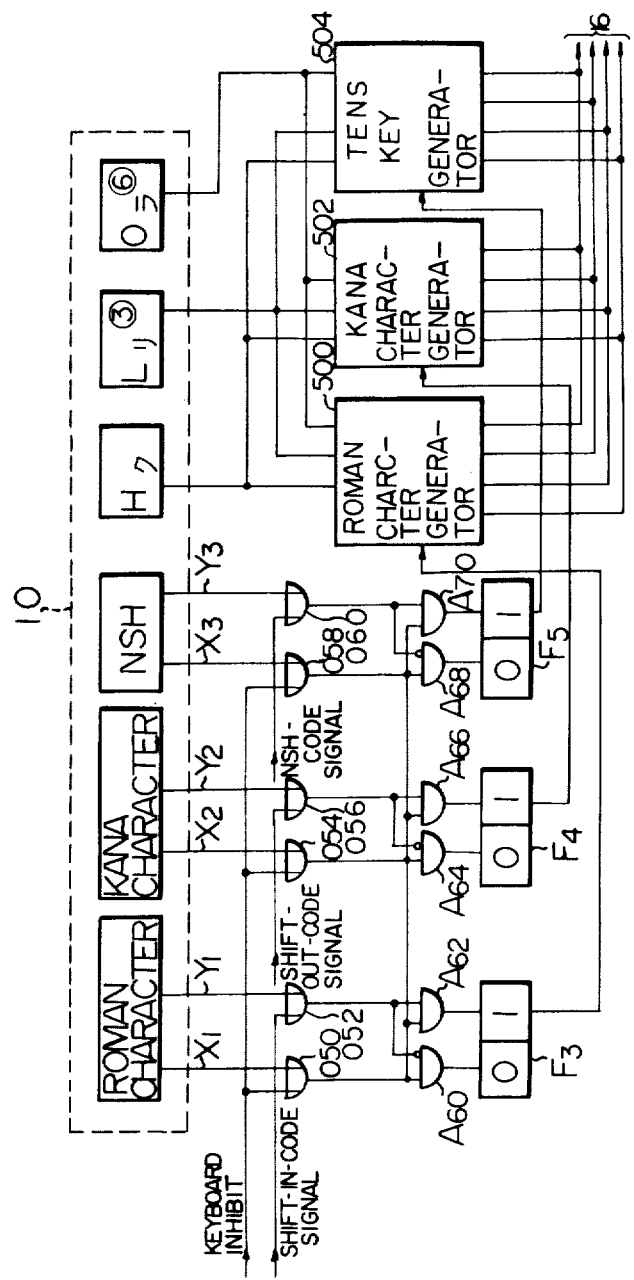
FIG. 9 is a schematic block diagram of a character set selection circuit including a subset of "tens keys" arranged in the configuration of a hand or desk calculator keyboard in accordance with the present invention.

As described hereinabove, the character keys of the keyboard 10 are used to enter Roman characters, Japanese katakana characters, Roman symbols and kana symbols. A subset of the character keys 15 arranged in a "tens key" configuration similar to a hand or desk calculator keyboard, and are adapted to also enter digital numbers and mathematical functions into the display unit 34 in said configuration. The character selection circuit is shown in FIG. 9, along with typical keys of the keyboard 10. All of the character keys of the keyboard 10 are connected to respective inputs of a Roman letter generator 500, a kana character generator 502 and a tens key generator 504. Roman and kana symbol generators are not shown for simplicity of illustration. The outputs of the generators 500, 502 and 504 are connected in parallel and constitute the line 16. Each generator 500, 502 and 504 has 8 outputs corresponding to the data bits designating the characters, although only 4 outputs are shown. The "1" side outputs of flip-flops F3, F4 and F5 are connected to control inputs of the generators 500, 502 and 504 respectively. Shift pulse outputs of the keys ROMAN CHARACTER, KANA CHARACTER and NSH keys of the keyboard 10 are designated as X1, X2 and X3 which are connected to inputs of OR gates O50, O54 and O58 respectively. Outputs of the tape reader 12 and the card reader 14 are also connected to inputs of the OR gates O50, O54 and O58. Outputs of the OR gates O50, O54 and O58 are connected in parallel to inputs of AND gates A60, A62, A64, A66, A68 and A70. The outputs of the AND gates A60, A64 and A68 are connected to the "0" side inputs of the flip-flops F3, F4 and F5 respectively. The outputs of the AND gates A62, A66 and A70 are connected to the "1" side inputs of the flip-flops F3, F4 and F5 respectively.

Select pulse outputs of the keys ROMAN CHARACTER, KANA CHARACTER and NSH are designated as Y1, Y2 and Y3 which are connected to inputs of OR gates O52, O56 and O60 respectively. The OR gate O52 has another input which receives a shift-in-code signal, the OR gate O56 has another input which receives a shift-out-code signal, and the OR gate O60 has another input which receives a NSH-code signal. The output of the OR gate O52 is connected to an input of the AND gate A62 and to an inverting input of the AND gate A60. The output of the OR gate O56 is connected to an input of the AND gate A66 and to an inverting input of the AND gate A64. The output of the OR gate O60 is connected to an input of the AND gate A70 and to an inverting input of the AND gate A68.

In operation, when it is desired to input Roman characters, the ROMAN CHARACTER key is depressed. A shift pulse output X1 is produced and applied through the OR gate O50 to the inputs of all of the AND gates A60, A62, A64, A66, A68 and A70. The outputs Y2 and Y3 of the KANA CHARACTER and NSH keys, that is, the outputs of the OR gates O56 and O60 are in this case logically low, so the AND gates A64 and A68 are enabled and the AND gates A66 and A70 are inhibited. The shift pulse X1, that is, the output of the OR gate O50 is thereby applied to the "0" side inputs of the flip-flops F4 and F5 to reset the same. Since the "1" side outputs of the flip-flops F4 and F5 are low, the kana character generator 502 and the tens key generator 504 will be inhibited. However, depression the ROMAN LETTER key causes the output Y1, that is, the output of the OR gate O52 to be logically high, so that the AND gate A62 is enabled and the AND gate A60 is inhibited. The shift pulse X1, that is, the output of the OR gate O50 is thereby gated to the "1" side input of the flip-flop F3 to set the same. The high "1" side output of the flip-flop F3 enables the Roman character generator 500 so that depression of a character key of the keyboard 10 will generate a Roman character. Depression of the center character key shown in FIG. 9 will produce data representing the character "L" at the output of the keyboard 10. Depression of the KANA CHARACTER and NSH keys will generate logically high X2 and Y2 and X3 and Y3 outputs respectively to enable the desired kana character generator 502 or tens key generator 504. The tens key generator 504, however, will not produce an output if a character key not included in the subset of tens key character keys is depressed. It is to be appreciated that the above-mentioned operation is carried out in the event of the entrance of the shift-in-code signal, the shift-out-code signal or the NSH-code signal.

CHARACTER EMPHASIZATION OPERATION

Since the keyboard 10 shown in FIG. 2 is adapted to enter Japanese katakana characters and symbols in addition to Roman characters and symbols but comprises only the standard number of keys, the number of keys is insufficient to permit the entry of both capital (upper case) and small (lower case) Roman letters. It is therefore desirable to provide means for distinguishing or emphasizing capital letters. It is also desirable to emphasize various characters which are more important than others. The present invention provides various means for accomplishing these objects.

The keyboard 10 is adapted to comprise an EMPHASIZE key, which, when depressed followed by the depression of a character key, will cause the designated character to be emphasized to distinguish it from other characters.

Referring now to FIG. 10, a character may be emphasized in various ways. For example, a solid or dotted line may be displayed either above or below the character. If the cursor is a solid or dotted line below the character, the emphasization may be a solid or dotted line above the character. If the cursor and emphasization are both lines below the character, one may be dotted and the other may be solid. Alternatively, the cursor may be adapted to blink on and off. Another preferred method of emphasizing a character is to make it appear as slanted on the cathode ray tube 85. In FIG. 10, the second character is shown in the form of the character "A" slanted to the right. All of the emphasization methods will be described in detail below.

It will be recalled that each character is designated by a binary word of 8 bits. In practice, a 7 bit word is sufficient to designate all of the characters, instruction words and functions required by the data processing system. The extra bit is used to designate character emphasization.

Depression of the EMPHASIZATION key of the keyboard 10 causes the 8th bit of the character subsequently entered to be logical "1", to distinguish the character from other characters to be displayed normally for which the 8th bit is logical "0". To display a dotted line above or below the selected character, the character generator 80 is adapted to sense the 8th bit and generate logical high outputs for the 2nd to 6th dot positions of the first or 10th scan line respectively when the 8th bit is logical "1". To display a solid line, a multivibrator (not shown) may be triggered to generate a pulse having a width equal to 5 dot pulses when the second dot position of the 1st or 10th line is reached during the scanning operation.

Figure 11:
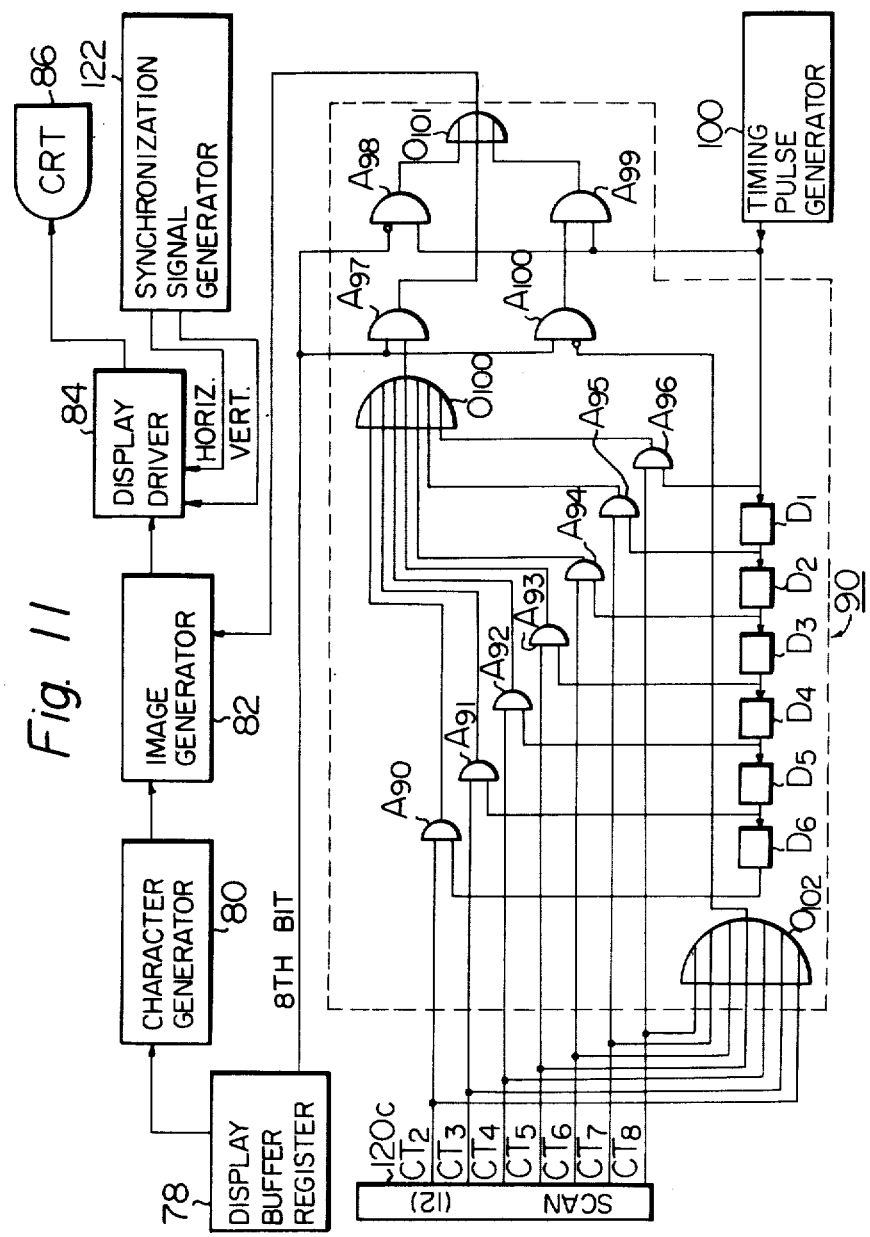
FIG. 11 is a schematic diagram, partly in block form, illustrating a circuit for producing the slanted character display as shown in FIG. 10.

The character emphasization unit 90, which is adapted to slant a selected character, is shown in detail in FIG. 11. The scan counter 120c of the display counter 120 is arranged to produce logically high outputs on lines designated as CT2 to CT8 when the count in the scan counter 120c is 2 to 8 respectively. The lines CT2 to CT8 are connected to inputs of AND gates A90 to A96 respectively. Six delay elements D1 to D6 are connected in series, and the dot pulse output of the timing pulse generator 100 is connected to the input of the delay element D1. The dot pulse output of the timing pulse generator 100 is further applied to an input of the AND gate A96. The outputs of the delay elements D1 to D6 are applied to inputs of the AND gates A95 to A90 respectively. The outputs of the AND gates A90 to A96 are connected to inputs of an OR gate O100, the output of which is applied to an input of an AND gate A97. The output of the 8th stage (8th bit) of the display buffer register 78 is fed to an input of the AND gate A97, and also to an inverting input of an AND gate A98. The outputs of the AND gates A97 and A98 are connected to inputs of an OR gate O101. The dot pulse output of the timing pulse generator 100 is also applied to inputs of the AND gate A98 and an AND gate A99, the output of the AND gate A99 being applied to an input of the OR gate O101. The output of the OR gate O101 is connected to the dot pulse input of the image generator 82.

The lines CT2 to CT8 are also connected to respective inputs of an OR gate O102, the output of which is connected to an inverting input of an AND gate A100. The 8th bit output of the display buffer register 78 is also connected to an input of the AND gate A100, and the output of the AND gate A100 is connected to an input of the AND gate A99.

In operation, it will first be assumed that a character is to be displayed in the normal manner. The 8th bit output of the display buffer register 78 is therefore low, and the AND gates A97, A100 and A99 are inhibited. The AND gate A98 is enabled, and dot pulses from the timing pulse generator 100 are gated therethrough to the image generator 82 in a normal manner.

Next, it will be assumed that a character is to be displayed in a slanted manner. The 8th bit output of the display buffer register 78 is high, and the AND gates A97 and A100 are enabled while the AND gate A98 is inhibited. During the time of the first line scanning operation, the count in the scan counter 120c of the display counter 120 is 1, and the outputs of the AND gates A90 to A96 are low. The outputs of the OR gate O100 and the AND gate A97 are therefore logically low. The output of the OR gate O102 is also logically low, so the AND gate A100 produces a logically high output to enable the AND gate A99. The dot pulses are therefore gated through the AND gate A99 in a normal manner to the image generator 82 to permit the display of a cursor in the form of a dotted line above the character if desired.

During the scan of the second line, the output of the scan counter 102c on the line CT2 is high, and the AND gate A90 is enabled. The output of the OR gate O102 is also logically high, and the AND gates A100 and A99 are thereby inhibited. During the scan of the second line, the dot pulses delayed by all of the delay elements D1 to D6 will be gated through the AND gate A90, OR gate O100, AND gate A97 and OR gate O101 to the image generator 82. The effect is shown in FIG. 10. The top line of the character, in this case the apex of the character "A", is shifted rightward by about 1.5 dot position. During the 3rd line scanning operation, the AND gate A90 is inhibited and the AND gate A91 is enabled so that the dot pulses delayed by the delay elements D1 to D5 are gated through the AND gate A91 to the image generator 82. In this case, the dot pulses are delayed by 5 delay elements rather than 6 delay elements, and the 3rd line is not shifted rightward as much as the 2nd line. During the 4th to 7th line scanning operations, the AND gates A92 to A95 are sequentially enabled, and the dot pulses are delayed by respectively shorter times to produce a desired slanted character. During the 8th line scanning operation, the AND gate A96 is enabled, and the dot pulses are gated therethrough to the image generator 82 without delay. During the 9th to 12th line scanning operations, all gates shown are in the same states as described above with reference to the 1st line scanning operation, so the dot pulses are gated to the image generator 82 in a normal manner through the AND gate A99. This allows the cursor in the form of a dotted line below the character to be displayed.

The delay times of the delay elements D1 to D6 are equal, and may be any selected value within the following upper limit:

$6T \leq 2t$ where $T$ is the delay time of each delay element D1 to D6; and $t$ is the period of the dot pulses.

In the limiting case in which $6T = 2T$, the 6th dot position of the 2nd line of a slanted character is coincident with the 1st dot position of the 2nd line of the next character in the same line of characters.

FIELD MARK, INSERTION AND DELETION OPERATIONS

Figure 7:
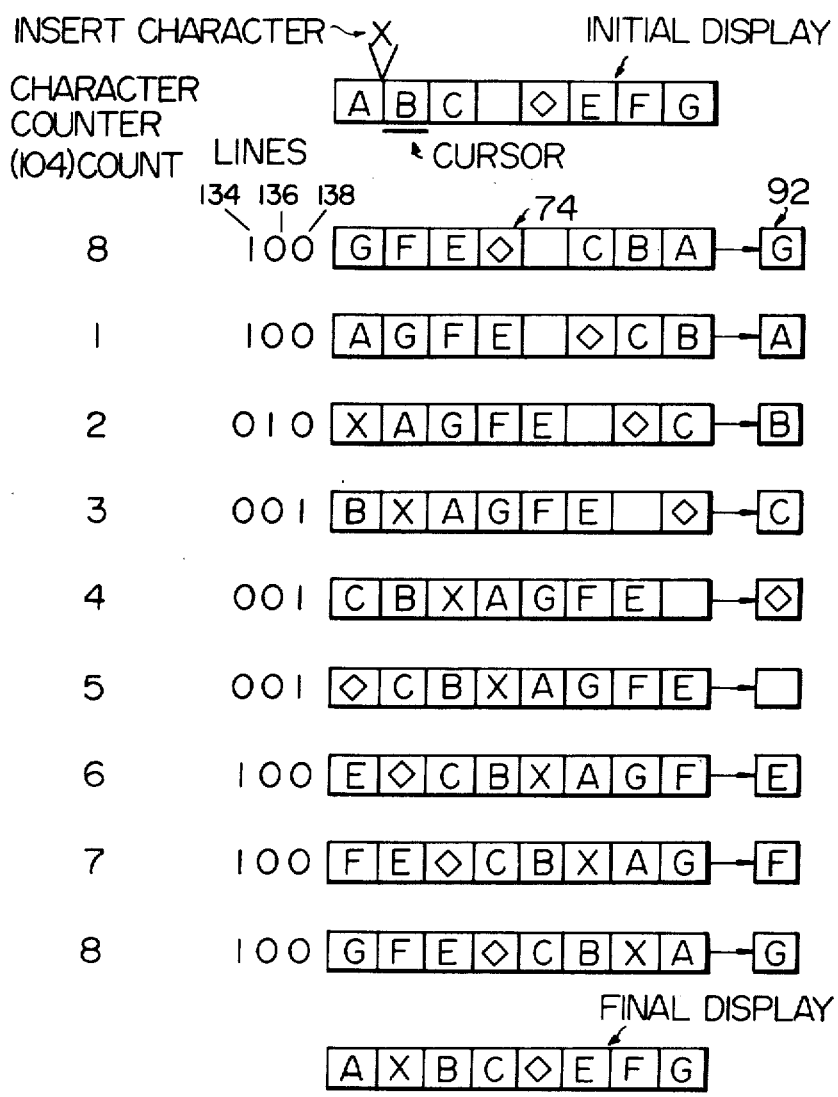
FIG. 7 is a graphic illustration of a data insertion operation involving a field mark in accordance with the present invention.
Figure 8:
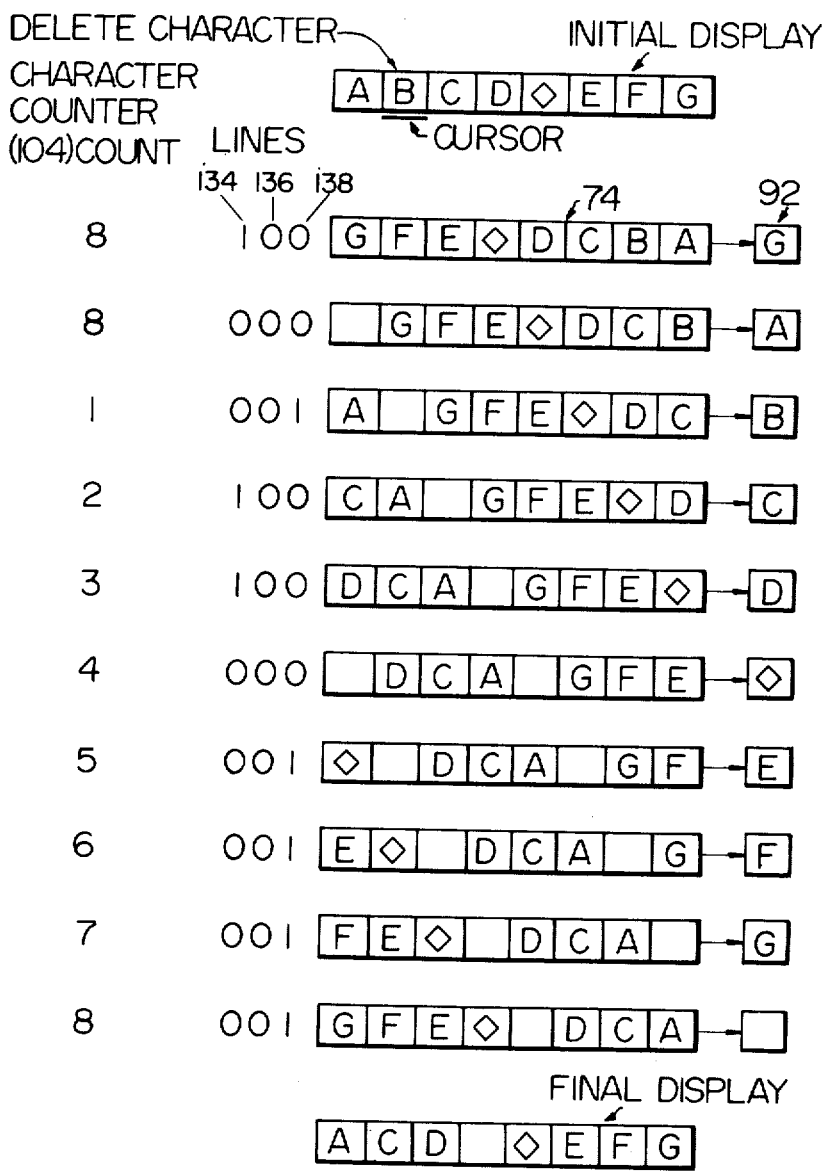
FIG. 8 is similar to FIG. 7, but illustrates a delete and fill operation involving a field mark in accordance with the present invention.

In order to facilitate creating columns of numbers and characters, a field mark or character, shown in FIGS. 7 and 8 as in the form of a diamond, may be entered into the data to divide the data into fields of variable length. An insertion or deletion operation is effective only within the field containing the cursor indicated position.

Right justification of a set of characters is easily performed utilizing the field mark in conjunction with the insertion function, and is extremely useful in preparing bills and the like. Referring now to FIG. 7, it will be recalled that the display consists of 512 characters arranged in 16 lines of 32 characters each. However, for simplicity of description and illustration, it will be assumed in the description of FIGS. 7 and 8 that the display consists of one line containing 8 characters, and that the main memory 74 is capable of storing 8 characters.

An exemplary initial display is shown at the top of FIG. 7, consisting of the characters "A", "B" and "C" followed by a blank, a field mark, and the characters "E", "F" and "G". Right justification of the character set constituted by the characters "A", "B" and "C" may be easily performed by moving the cursor into position under the "A", holding down the insert or INS key on the keyboard 10 and repeatedly depressing the SPACE key until the "C" is positioned directly to the left of the field mark. Even if the SPACE key is depressed an excessive number of times, the operation will terminate automatically when the "C" is next to the field mark. A field mark may be entered into the data by depressing a field mark or FM key on the keyboard 10.

An insertion operation will now be described with reference to FIG. 7, in which it is desired to insert the character "X" between the characters "A" and "B" as shown.

The cursor is moved into position below the character "B", and the INS key is depressed. An insertion code word is entered into the buffer register 70 and is decoded by the instruction decoder 86. The instruction decoder 86 feeds a signal to the insertion unit 142 of the gate control unit 88, which then assumes control of the computing unit 128.

The key for the character "X" is then depressed, and the character "X" is entered into the buffer register 70. It is assumed that the character counter 104 in this example has a maximum count of 8. Since the actual construction of the insertion unit 142 is complex and constituted by digital circuitry known in the art, the operation of the insertion unit 142 will be described in a functional manner only in order to avoid an overly detailed disclosure.

As the count in the character counter reaches 8, the characters are arranged as shown in the main memory 74 and functional buffer register 92. The insertion unit 142 controls the computing unit 128 which in turn generates the signals on the lines 134, 136 and 138 connected to the inputs of the AND gates A13, A12 and A14 respectively. In FIGS. 7 and 8, if the signals on the lines 134, 136 and 138 are logically high, they are designated by the symbol "1"; if logically low, they are designated by the symbol "0".

When the count in the character counter 104 is 8, the signals on the lines 134, 136 and 138 are 1, 0 and 0 respectively and the output of the main memory 74 is connected to its input through the AND gate A13.

As the count in the character counter reaches 1, the count decoder 106 feeds a signal to the insertion unit 142 indicating the beginning of the data, and the computing unit 128 changes the signals on the lines 134, 136 and 138 to 1, 0 and 0 respectively (in the example shown, the respective signals were already 1, 0 and 0). It will be noted that the cursor in under the second character position. As the count in the character counter 104 reaches 2 (equal to the count in the cursor counter 112), the count comparator 108 feeds a signal to the computing unit 128 causing the signals on the lines 134, 136 and 138 to become 0, 1 and 0 respectively. The character "X" is thereby entered into the main memory 74 through the AND gate A12.

It will be noted that the output of the main memory 74 is connected to the input of the functional buffer register 92 so that when the contents of the last stage of the main memory 74 correspond to a character position ($n$) of the display, the contents of the functional buffer register 92 correspond to a character position ($n-1$). As the count in the character counter reaches 3 (one count after equality of the counts in the character and cursor counters 104 and 112 respectively), the computing unit 128 changes the signals on the lines 134, 136 and 138 to 0, 0 and 1 respectively so that the output of the functional buffer register 92 is connected to the input of the main memory 74 through the AND gate A14. The character "B" from the functional buffer register 92 is gated into the first data position in the main memory 74.

As the count in the character counter 104 reaches 4, the field mark is shifted into the functional buffer register 92 and detected therein by the function decoder 94. The function decoder 94 feeds a signal to the computing unit 128. As the count of the character counter 104 reaches 6 (two counts after the field mark was detected), the computing unit 128 changes the signals on the lines 134, 136 and 138 to 1, 0 and 0 respectively to connect the output of the main memory 74 to its input through the AND gate A13. This status exists for the remainder of the insertion operation. If the field mark were not detected, the signals on the lines 134, 136 and 138 would remain 0, 0 and 1 until the end of the insertion operation, in which case the last character would be overflowed from the main memory 74 and lost. The signals on the lines 134, 136 and 138 would be changed to 1, 0 and 0 respectively when the next count of 1 in the character counter 104 was detected by the count decoder 108. It will be noted from examination of the final display that the characters to the right of the field mark were not altered in any way. During the next cycle of the main memory 74, when the count in the character counter 104 reaches 4, the field mark will be shifted to the functional buffer register 92 whereas the character "C" will be shifted into the last position in the main memory 74. The outputs of both the last position of the main memory 74 and the functional buffer register 92 are connected to inputs of the function decoder 94, and the function decoder 94, upon sensing a character code other than a blank in the last data position of the main memory 74 simultaneously with sensing the field mark in the functional buffer register 92 will feed a signal to the computing unit 128 to inhibit further insertion operations in the field constituted by the characters "A", "X", "B" and "C".

A delete and fill operation will now be described with reference to FIG. 8. In the example shown, it is desired to delete the character "B" and move the characters "C" and "D" leftward by one space to fill in the blank space created by the deletion.

The cursor is moved into position under the character "B" and the delete and fill key DLF of the keyboard 10 is pressed so that a delete and fill code word is entered into the buffer register 70. This code is detected by the instruction decoder 86, which feeds a signal to the gate control unit 88 to actuate the deletion unit 144 which controls the computing unit 128. As with the insertion unit 142, the operation of the deletion unit 144 will be described only functionally.

As the character counter 104 reaches a count of 8, the count decoder 106 feeds a signal to the computing unit 128 which feeds a logically low signal to the gate unit 102 to inhibit the same. As the result, the next pulse for shifting the main memory 74 will shift the main memory 74, but the pulse will not reach the character counter 104 and the count in the character counter 104 will remain 8. In this condition, the signals on the lines 134, 136 and 138 are 0, 0 and 0 respectively so that a blank space is created in the first data position of the main memory 74. After this shifting operation, the computing unit 128 again feeds a logically high signal to the gate unit 102 to enable the same.

As the count in the character counter 104 reaches 1, the count decoder 106 feeds a signal to the computing unit 128 which changes the signals on the lines 134, 136 and 138 to 0, 0 and 1 respectively so that the output of the functional buffer register 92 is gated to the input of the main memory 74 through the AND gate A12. When the count in the character counter 104 becomes 2 (equal to the count in the cursor counter 112), the count comparator 108 feeds a signal to the computing unit 128 which changes the signals on the lines 134, 136 and 138 to 1, 0 and 0 respectively. When the count in the character counter 104 reaches 4, the field mark is detected in the functional buffer register 92 by the function decoder 94, which feeds a signal to the computing unit 128 to change the signals on the lines 134, 136 and 138 to 0, 0 and 0 respectively creating another blank space in the first data position of the main memory 74.

When the count in the character counter 104 reaches 5 (one count after the field mark was detected in the functional buffer register 92), the computing unit 128 changes the signals on the lines 134, 136 and 138 to 0, 0 and 1 respectively so that the output of the functional buffer register 92 is gated to the input of the main memory 74 through the AND gate A14. This condition remains until the end of the delete and fill operation. When the count decoder 106 again detects the count of 1 in the character counter 104, it feeds a signal to the computing unit 128 to change the signals on the lines 134, 136 and 138 to 1, 0 and 0 respectively so that the output of the main memory 74 is connected to the input thereof to recirculate the data through the main memory 74. It will be noticed that the data to the right of the field mark was not altered in any way by the delete and fill operation.

Although the insertion and delete and fill operations have been described and illustrated utilizing only one field mark, and number of field marks may be provided within the scope of the invention to divide the data into any number of variable length fields.

In addition, functions such as tabulation, transfer of the data stored in the main memory 74 to the auxiliary memory in partial form and the like may be added to a data processing system of the present invention since they are known in the art.

What is claimed is:

1. In a data processing system having display means including an electronic graphic display device to display input data representing a predetermined number of characters, input means to enter data into the display device and output means to output the data, the improvement comprising:

memory means connected between the display means and the output means;

control means operatively connected to control the display means;

memory means and output means to selectively transfer data from the display means to the memory means and store the data therein and transfer the data from the memory means to the output means; whereby data stored in the memory means may be transferred to the output means while new data is being entered into the display means;

in which the input data may comprise a field mark or character to divide the predetermined number of characters into two fields of characters, the display means comprising field mark detection means to detect the field mark;

in which the input data may comprise an instruction to insert a character at a designated location in the data between the beginning of the data and the field mark, the display means comprising data insertion means to enter the designated character into the display at the designated location and shift the following characters toward the end of the data, the field mark detection means being operative to sense the input data and inhibit the insertion means if the field mark detection means detects the field mark proceded by a character; and in which the input data may further comprise an instruction to delete a character at a designated location in the data between the beginning of the data and the field mark, the display means comprising deletion means to delete the character at the designated location and shift the following characters toward the beginning of the data to fill in the blank spaces produced by the deletion, the field mark detection means being operative to sense the input data and inhibit the deletion means if the field mark detection means detects the field mark from shifting characters following the field mark in the data.

2. The system of claim 1, in which the input means is adapted to designate a character to be emphasized, the display means further comprising emphasization means to alter the display of the designated character so that the designated character will be slanted, the input means being arranged to alter the data representing the designated character so that it will be distinguished from other characters, and in which the emphasization means is operative to detect the altered data and alter the display of the designated character in response thereto.

3. The system of claim 2, in which the input means comprises a keyboard.

4. The system of claim 3, in which the keyboard is operative to enter data into the display device one character at a time, and in which the display device comprises means to display a cursor indicating the position of the next character to be entered.

5. The system of claim 4, in which the keyboard is operative, upon manual actuation, to control the display means to move the cursor to a desired position.

6. The system of claim 5, in which the display means further comprises warning means to produce a warning indication when the cursor reaches a predetermined character position before the last character position of the display.

7. The system of claim 5, in which the display means further comprises warning means to produce a warning when the cursor reaches the last character position of the display.

8. The system of claim 3, in which the keyboard comprises a set of character keys, the character keys being operative to enter alphanumeric character data into the display device and a subset of the character keys being arranged in a "tens key" configuration constituted by digital numbers and mathematical functions and operative to enter data representing the respective digital numbers and mathematical functions into the display device, the keyboard further comprising:

character data generating means having inputs connected to the character keys and outputs connected to the input of the display means;

an alphanumeric character selector key connected to control the character generating means to generate data representing alphanumeric characters upon depression of the respective character keys; and a "tens key" character selector key connected to control the character data generating means to generate only data representing digital numbers and mathematical functions upon depression of the respective character keys of the subset of character keys.

9. The system of claim 3, in which the input means further comprises an additional input unit, and in which the keyboard comprises input device selection keys operative, when manually depressed, to actuate the control means to cause the display means to accept input data from the one of the keyboard and the additional input unit corresponding to the input device selection key depressed.

10. A data processing system comprising:

an input keyboard;

a display unit;

an output unit;

an auxiliary memory connected between the display unit and the output unit; and a control unit;

the display unit comprising: